US009130547B1

(12) United States Patent
Lin

(10) Patent No.: US 9,130,547 B1
(45) Date of Patent: Sep. 8, 2015

(54) RAIL-TO-RAIL COMPARATOR CIRCUIT AND METHOD THEREOF

(71) Applicant: Realtek Semiconductor Corp., Hsinchu (TW)

(72) Inventor: Chia-Liang Leon Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/333,539

(22) Filed: Jul. 17, 2014

(51) Int. Cl.
*H03K 5/22* (2006.01)
*H03K 3/012* (2006.01)
*H03K 5/125* (2006.01)
*H03K 17/687* (2006.01)

(52) U.S. Cl.
CPC ............... *H03K 3/012* (2013.01); *H03K 5/125* (2013.01); *H03K 17/687* (2013.01)

(58) Field of Classification Search
CPC ......... H03K 5/22; H03K 5/24; H03K 5/2472; H03K 5/2481; H03K 5/249
USPC ............ 327/51, 52, 54–57, 63–65, 67, 68, 97
See application file for complete search history.

(56) References Cited

U.S. PATENT DOCUMENTS

| 8,866,531 B2 * | 10/2014 | Gupta et al. .................. 327/336 |
| 2006/0164126 A1 * | 7/2006 | Mulder et al. .................. 327/52 |
| 2013/0120025 A1 * | 5/2013 | Inoue .............................. 327/67 |

* cited by examiner

*Primary Examiner* — William Hernandez
(74) *Attorney, Agent, or Firm* — McClure, Qualey & Rodack, LLP

(57) ABSTRACT

A circuit includes a PMOS transistor pair receiving a first voltage at a first circuit node and a second voltage at a second circuit node and outputting a third voltage at a third circuit node and a fourth voltage at a fourth circuit node; and an NMOS transistor pair receiving the third voltage at the third circuit node and the fourth voltage at the fourth circuit node and outputting the first voltage at the first circuit node and the second voltage at the second circuit node. The circuit further includes a first voltage-controlled resistor controlled by a first control voltage and a second control voltage in accordance with a clock signal providing a coupling between the third voltage at the third circuit node and the second voltage at the second circuit node; and a second voltage-controlled resistor controlled by the second control voltage and the first control voltage in accordance with the clock signal providing a coupling between the fourth voltage at the fourth circuit node and the first voltage at the first circuit node.

8 Claims, 4 Drawing Sheets

RAIL-TO-RAIL COMPARATOR CIRCUIT AND METHOD THEREOF

BACKGROUND OF THE INVENTION

1. Field of the Invention

The present invention generally relates to comparator circuits and more particularly to comparator circuits exhibiting a relatively high-speed operation, while maintaining relatively low power consumption.

2. Description of Related Art

Persons of ordinary skill in the art understand terms and basic concepts related to microelectronics that are used in this disclosure, such as PMOS (p-channel metal-oxide semiconductor) transistor, NMOS (n-channel metal-oxide semiconductor) transistor, "gate," "source," "drain," "voltage," "current," "circuit," "circuit node," "power supply," "ground," "rail-to-rail," "clock," "comparator," "inverter," "pull-up," "pull-down" and "latch". Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

A clocked comparator is an apparatus for detecting a sign of a differential signal in accordance with a timing defined by a clock. A differential signal comprises a first end and a second end. A clocked comparator receives the differential signal and outputs a logical decision in accordance with a timing defined by a clock. In a phase of the clock, a level of the first end (of the differential signal) is compared with a level of the second end (of the differential signal), and the logical decision (which is a resolution as a result of the comparison) is made. The logical decision is set to "high" ("low") if the level of the first end is higher (lower) than the level of the second end. Merits of a clocked comparator are usually assessed by two factors: speed and power consumption. Speed of a clocked comparator refers to how fast it can resolve a small differential signal, where a level of the first end is very close to a level of the second end. Power consumption of a clocked comparator refers to the energy it takes to fulfill the comparison function. In reality, there is a trade-off between the speed and the power consumption. As known in prior art, it takes a longer time to resolve a comparison for a small differential signal than for a large differential signal. Therefore, to achieve high speed, a pre-amplifier is usually used, so as to amplify the differential signal and thus facilitate the task of resolving the comparison. The use of a pre-amplifier, however, increases the overall power consumption.

BRIEF SUMMARY OF THIS INVENTION

An objective of this present invention is to have a comparator of relatively high speed, yet relatively low power consumption.

An objective of this present invention is to enable a comparator to rapidly resolve a comparison between two signals and automatically shut itself off to save power after the comparison is resolved.

In an embodiment, a circuit comprises: a PMOS transistor pair receiving a first voltage at a first circuit node and a second voltage at a second circuit node and outputting a third voltage at a third circuit node and a fourth voltage at a fourth circuit node; an NMOS transistor pair receiving the third voltage at the third circuit node and the fourth voltage at the fourth circuit node and outputting the first voltage at the first circuit node and the second voltage at the second circuit node; a first voltage-controlled resistor controlled by a first control voltage and a second control voltage in accordance with a clock signal providing a coupling between the third voltage at the third circuit node and the second voltage at the second circuit node; and a second voltage-controlled resistor controlled by the second control voltage and the first control voltage in accordance with the clock signal providing a coupling between the fourth voltage at the fourth circuit node and the first voltage at the first circuit node, wherein the first voltage-controlled resistor and the second voltage-controlled resistor are constructed using the same circuit but interfacing with the first control voltage and the second control voltage in a different way so that a difference between the first control voltage and the second control voltage leads to a difference between a resistance of the first voltage-controlled resistor and a resistance of the second voltage-controlled resistor.

In an embodiment, a method comprises: incorporating a PMOS transistor pair receiving a first voltage at a first circuit node and a second voltage at a second circuit node and outputting a third voltage at a third circuit node and a fourth voltage at a fourth circuit node; incorporating an NMOS transistor pair receiving the third voltage at the third circuit node and the fourth voltage at the fourth circuit node and outputting the first voltage at the first circuit node and the second voltage at the second circuit node; coupling the third voltage at the third circuit node to the second voltage at the second circuit node via a first voltage-controlled resistor controlled by a first control voltage and a second control voltage in accordance with a clock signal; and coupling the fourth voltage at the fourth circuit node to the first voltage at the first circuit node via a second voltage-controlled resistor controlled by the second control voltage and the first control voltage in accordance with the clock signal, wherein the first voltage-controlled resistor and the second voltage-controlled resistor are constructed using the same circuit but interfacing with the first control voltage and the second control voltage in a different way so that a difference between the first control voltage and the second control voltage leads to a difference between a resistance of the first voltage-controlled resistor and a resistance of the second voltage-controlled resistor.

DETAILED DESCRIPTION OF THIS INVENTION

The present invention relates to comparator circuits. While the specification describes several example embodiments of the invention considered favorable modes of practicing the invention, it should be understood that the invention can be implemented in many ways and is not limited to the particular examples described herein or to the particular manner in which any features of such examples are implemented. In other instances, well-known details are not shown or described to avoid obscuring aspects of the invention.

Throughout this disclosure: "VDD" denotes a power supply circuit node (or simply power supply node); a logical signal is a signal that is either "high" or "low"; it is said to be "high" when the logical signal is of a high voltage level that is equal to a voltage level of a power supply node (which is denoted by VDD in this disclosure); and it is said to be "low" when the logical signal is of a low voltage level that is equal to a voltage level of a ground node. It should be understood that, in this disclosure, "equal to" is stated in an engineering sense. For instance, if a difference between a first voltage A and a second voltage B is smaller than a specified tolerance of interest, the difference is negligible and as a result the first voltage A is said to be equal to the second voltage B in the engineering sense. Likewise, "zero" in this disclosure is also stated in an engineering sense; for instance, if a current is smaller than a specified tolerance of interest, the current is negligible and as a result is said to be zero in the engineering sense. In addition, a logical signal might be temporarily neither "high" nor "low"; this occurs, for instance, when the logical signal is in a process of transitioning from "high" to "low" or from "low" to "high," or in a process of resolving a decision. However, the logical signal is still said to be "logical" in nature because the process of transitioning or resolving is only temporary.

Figure 1A:
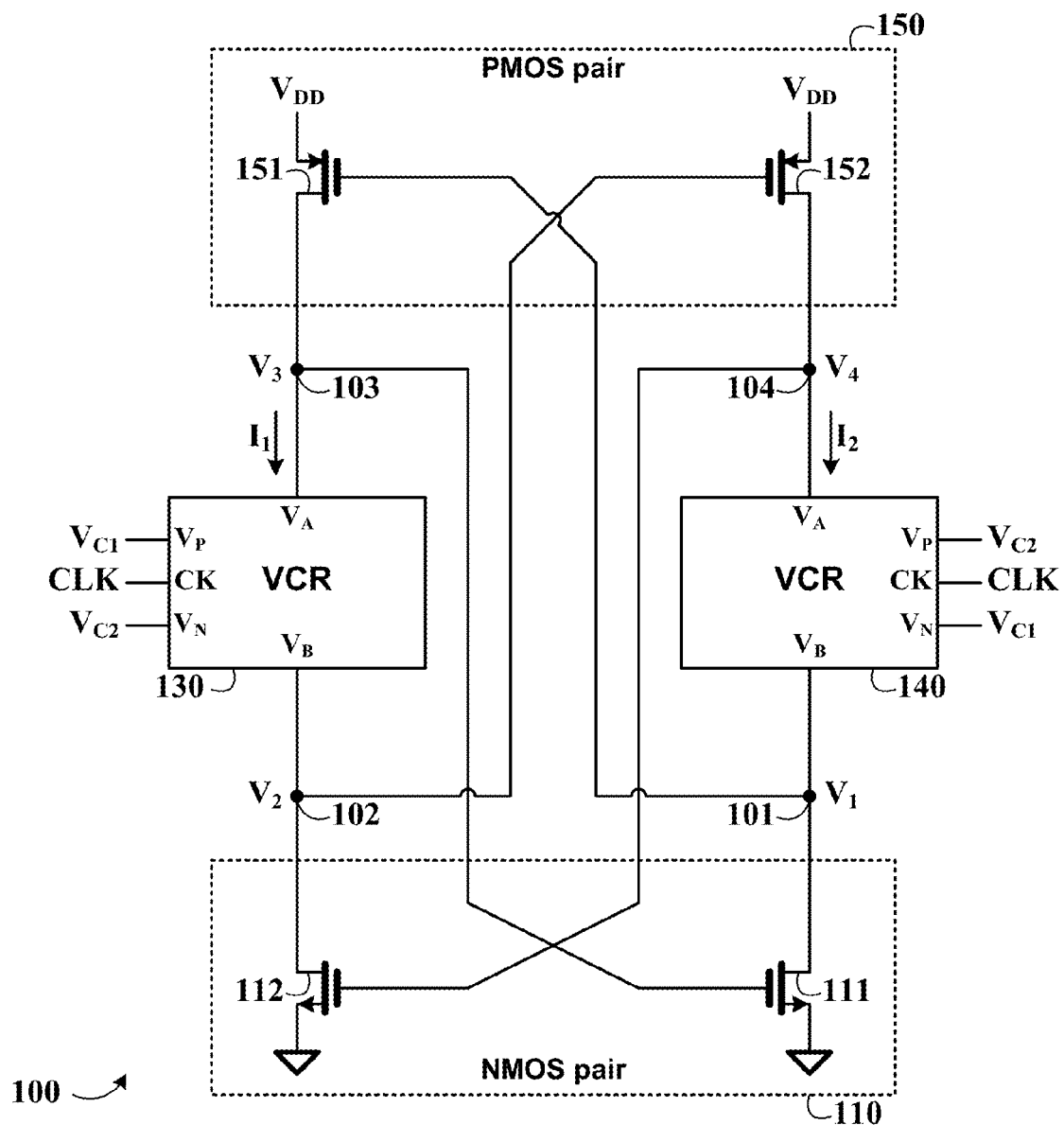
FIG. 1A shows a functional block diagram of a comparator in accordance with an embodiment of the present invention.

A schematic diagram of a comparator circuit 100 in accordance with an embodiment of the present invention is shown in FIG. 1A. Comparator circuit 100 comprises: a PMOS transistor pair 150 (comprising PMOS transistors 151 and 152) for receiving a first voltage V1 at a first circuit node 101 and a second voltage V2 at a second circuit node 102 and outputting a third voltage V3 at a third circuit node 103 and a fourth voltage V4 at a fourth circuit node 104; an NMOS transistor pair 110 (comprising NMOS transistors 111 and 112) for receiving the third voltage V3 at the third circuit node 103 and the fourth voltage V4 at the fourth circuit node 104 and outputting the first voltage V1 at the first circuit node 101 and the second voltage V2 at the second circuit node 102; a first voltage-controlled resistor (VCR) 130 controlled by a first control voltage VC1 and a second control voltage VC2 in accordance with a clock signal CLK for providing a coupling between the third voltage V3 at the third circuit node 103 and the second voltage V2 at the second circuit node 102; and a second voltage-controlled resistor (VCR) 140 controlled by the second control voltage VC2 and the first control voltage VC1 in accordance with the clock signal CLK for providing a coupling between the fourth voltage V4 at the fourth circuit node 104 and the first voltage V1 at the first circuit node 101. Note that the NMOS transistor pair 110 and PMOS transistor pair 150 form a positive feedback loop: an increase (decrease) of V3 leads to a decrease (increase) of V1 (due to NMOS transistor 111), which in turn leads to an increase (decrease) of V3 (due to PMOS transistor 151); an increase (decrease) of V4 leads to a decrease (increase) of V2 (due to NMOS transistor 112), which in turn leads to an increase (decrease) of V4 (due to PMOS 152). Due to the positive feedback nature, a change at V3 or V4 is self-accelerating, resulting in either V3 rising to VDD and V4 falling to ground, or V3 falling to ground and V4 rising to VDD. If V3 and V4 are both falling down from VDD, a race condition occurs and the one that falls more rapidly will win the race and fall to ground while the other one will be pulled high to VDD. The first control voltage VC1 and the second control voltage VC2 determine which one between V3 and V4 rises to VDD and which one falls to ground.

Figure 1B:
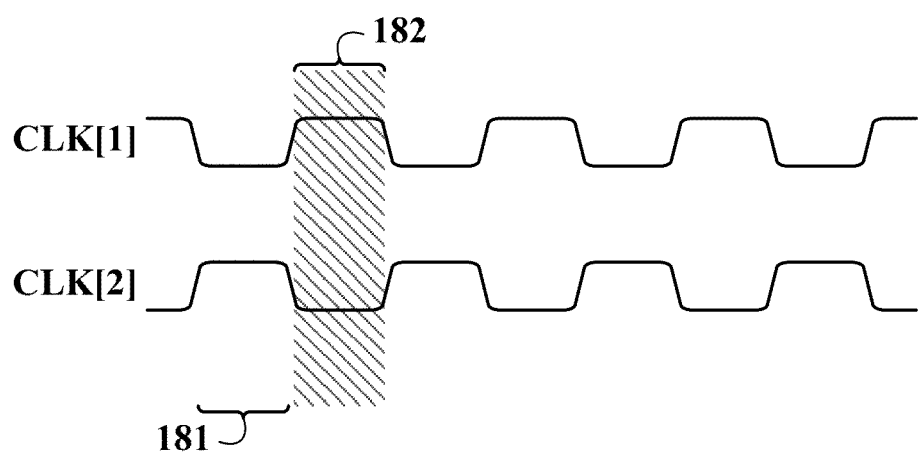
FIG. 1B shows a timing diagram of the clock signal for the comparator of FIG. 1A.

Reference is now made to FIG. 1A. The clock signal CLK includes a first clock CLK[1] and a second clock CLK[2] that is a complementary (i.e., logically inverted) clock of the first clock CLK[1], as depicted in an exemplary timing diagram shown in FIG. 1B. The clock signal CLK defines a phase of the comparator circuit 100; when CLK[1] is low and CLK[2] is high (e.g. region 181), the comparator circuit 100 is in a preset phase where voltages at certain circuit nodes within VCR 130 and VCR 140 are preset to certain levels; when CLK[1] is high and CLK[2] is low (e.g., region 182), the comparator circuit 100 is in an active phase where a task of comparison between VC1 and VC2 takes place. In the preset phase, V3 and V4 are both pulled high to VDD by VCR 130 and VCR 140; upon entering the active phase, V3 and V4 are both falling from VDD; if the resistance of VCR 130 is greater (smaller) than the resistance of VCR 140, a first current I1 flowing into VCR 130 will be smaller (greater) than a second current I2 flowing into VCR 140; this causes V3 (V4) to fall more slowly (rapidly) than V4 (V3); due to the positive feedback mentioned earlier, V4 (V3) will win the race and fall to ground while V3 (V4) will be pulled up back to VDD. Comparator circuit 100, therefore, can be used to resolve a difference between the first control voltage VC1 and the second control voltage VC2 via their respective impacts on the resistances of VCR 130 and VCR 140.

VCR 130 and VCR 140 are of the same circuit, but controlled differently so that the difference between the resistance of VCR 130 and the resistance of VCR 140 represents the difference between VC1 and VC2. Both VCR 130 and VCR 140 are a variable resistor providing a resistance between two terminals denoted as "VA" and "VB"; the resistance is determined by two control signals (either VC1 and VC2, or VC2 and VC1) received at two terminals denoted as "VP" and "VN" in accordance with a timing determined by the clock signal CLK received at a terminal denoted as "CK."

Figure 2:
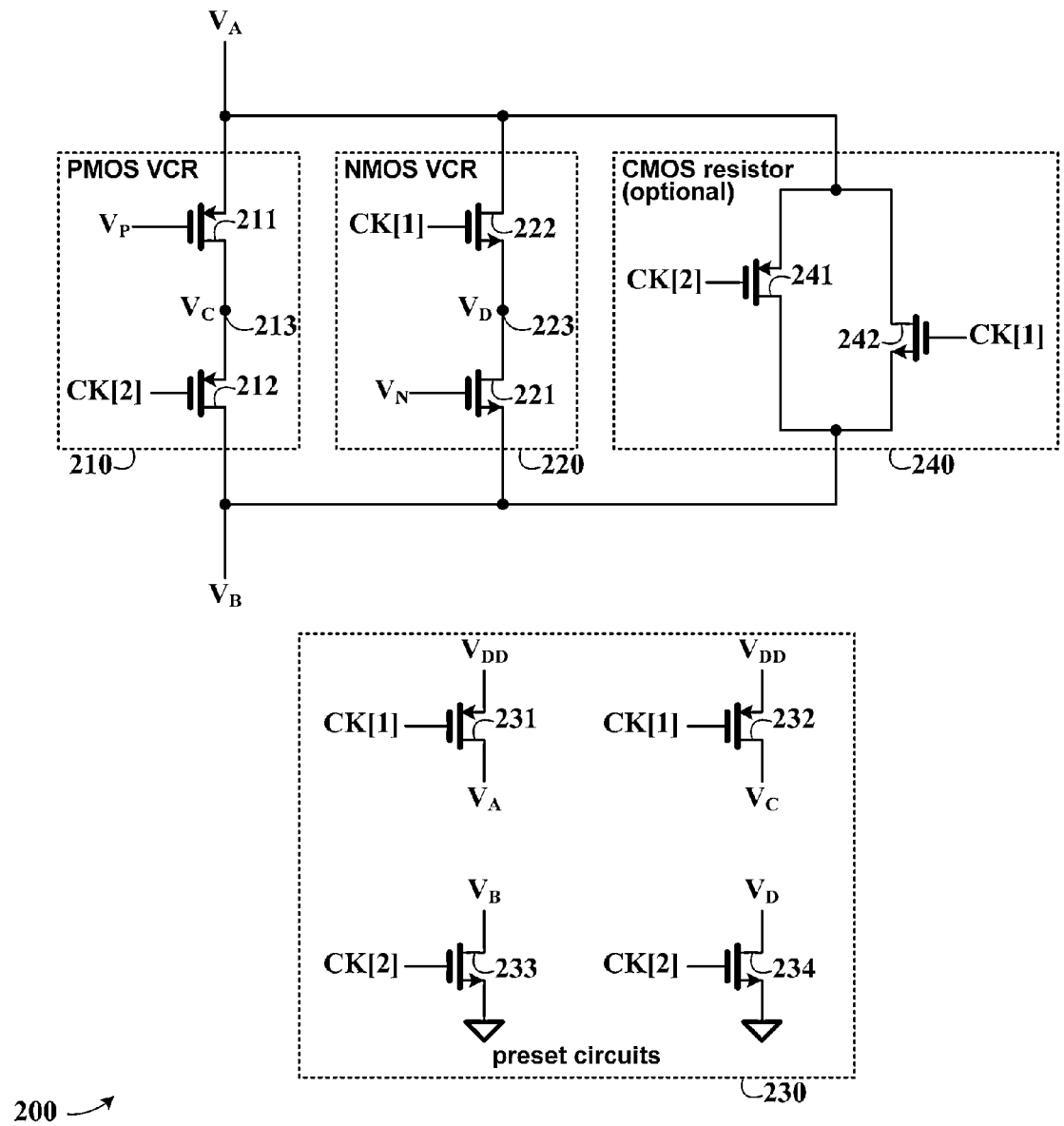
FIG. 2 shows a schematic diagram of a voltage-controlled resistor suitable for use in the comparator of FIG. 1A.

A schematic diagram of a voltage-controlled resistor (VCR) 200 suitable for embodying VCR 130 and 140 of FIG. 1A is shown in FIG. 2. VCR 200 comprises a "VA" terminal for coupling to either V3 or V4 (see FIG. 1A), a "VB" terminal for coupling to either V2 or V1 (see FIG. 1A), a "VP" terminal for coupling to either VC1 or VC2 (see FIG. 1A), a "VN" terminal for coupling to either VC2 or VC1 (see FIG. 1A), and two clock terminals "CK[1]" and "CK[2]" for coupling to the clock signal CLK (see FIG. 1A) that comprises CLK[1] and CLK[2] as mentioned earlier. (In FIG. 1A, "CLK" and "CK" are shown for brevity; it must be understood that CLK comprises two clocks CLK[1] and CLK[2], while CK comprises two terminals CK[1] and CK[2], for interfacing with CLK[1] and CLK[2], respectively.)

As shown in FIG. 2, VCR 200 comprises: PMOS VCR 210 (comprising a serial connection of PMOS transistor 211 controlled by the signal from terminal VP and PMOS transistor 212 controlled by the clock from terminal CK[2]), NMOS VCR 220 (comprising a serial connection of NMOS transistor 221 controlled by the signal from terminal VN and NMOS transistor 222 controlled by the clock from terminal CK[1]), and a set of preset circuits 230 comprising PMOS transistors 231 and 232 for pulling up the voltages at terminals VA and VC to VDD when the clock from terminal CK[1] is low and NMOS transistors 233 and 234 for pulling down the voltages at VB and VD to ground when the clock from terminal CK[2] is high. VCR 200 further comprises an optional CMOS resistor 240 comprising a PMOS transistor 241 controlled by the clock from terminal CK[2] and an NMOS transistor 242 controlled by the clock from terminal CK[1].

During the preset phase where the clock CLK[1] is low and the clock CLK[2] is high (see FIG. 1A and FIG. 1B), the clock at terminal CK[1] is low and the clock at terminal CK[2] is high (see FIG. 2); in this phase, the voltages at VA and VC are pulled up to VDD, the voltages at VB and VD are pulled down to ground, and the PMOS VCR 210, the NMOS VCR 220, and the CMOS resistor 240 are all disabled and behave like an open circuit. During the active phase where the clock CLK[1] is high and the clock CLK[2] is low (see FIG. 1A and FIG.

1B), the clock at terminal CK[1] is high and the clock at terminal CK[2] is low (see FIG. 2); in this phase, the preset circuits 230 are disabled, and the PMOS VCR 210, the NMOS VCR 220, and the CMOS resistor 240 are all enabled and behave like a resistor with a resistance controlled by the voltage at terminal "VP" and the voltage at terminal "VN". As illustrated in FIG. 1A, the "VP" and the "VN" terminals of VCR 130 interface with VC1 and VC2 respectively, while the "VP" and the "VN" terminals of VCR 140 interface with VC2 and VC1 respectively. Due to the difference in the interfacing, in the active phase, a difference between VC1 and VC2 will result in a difference between the resistance of VCR 130 and the resistance of VCR 140. As mentioned earlier, this will cause one of V3 and V4 to rise to VDD while the other fall to ground.

Now refer back to FIG. 2. The PMOS VCR 210 and NMOS VCR 220 together form a "rail-to-rail" topology so that the voltage-controlled resistor 200 can work for a range of voltages at VP and VN that spans from the ground level to the supply level VDD. In a particular application, one may choose to remove NMOS VCR 220 along with the "VN" terminal at one's discretion if one is sure that a mean value of the voltage at VN is not higher than a voltage needed for turning on NMOS transistor 221, and may choose to remove PMOS VCR 210 along with the "VP" terminal at one's discretion if one is sure that a mean value of the voltage at VP is not lower than a voltage needed for turning on PMOS transistor 211. This concept of removing unnecessary circuits and terminals in a particular application is obvious to those of ordinary skill in the art and thus not described in detail here. Also, one may choose to remove PMOS transistor 241, or NMOS transistor 242, or both, at one's discretion.

Figure 3:
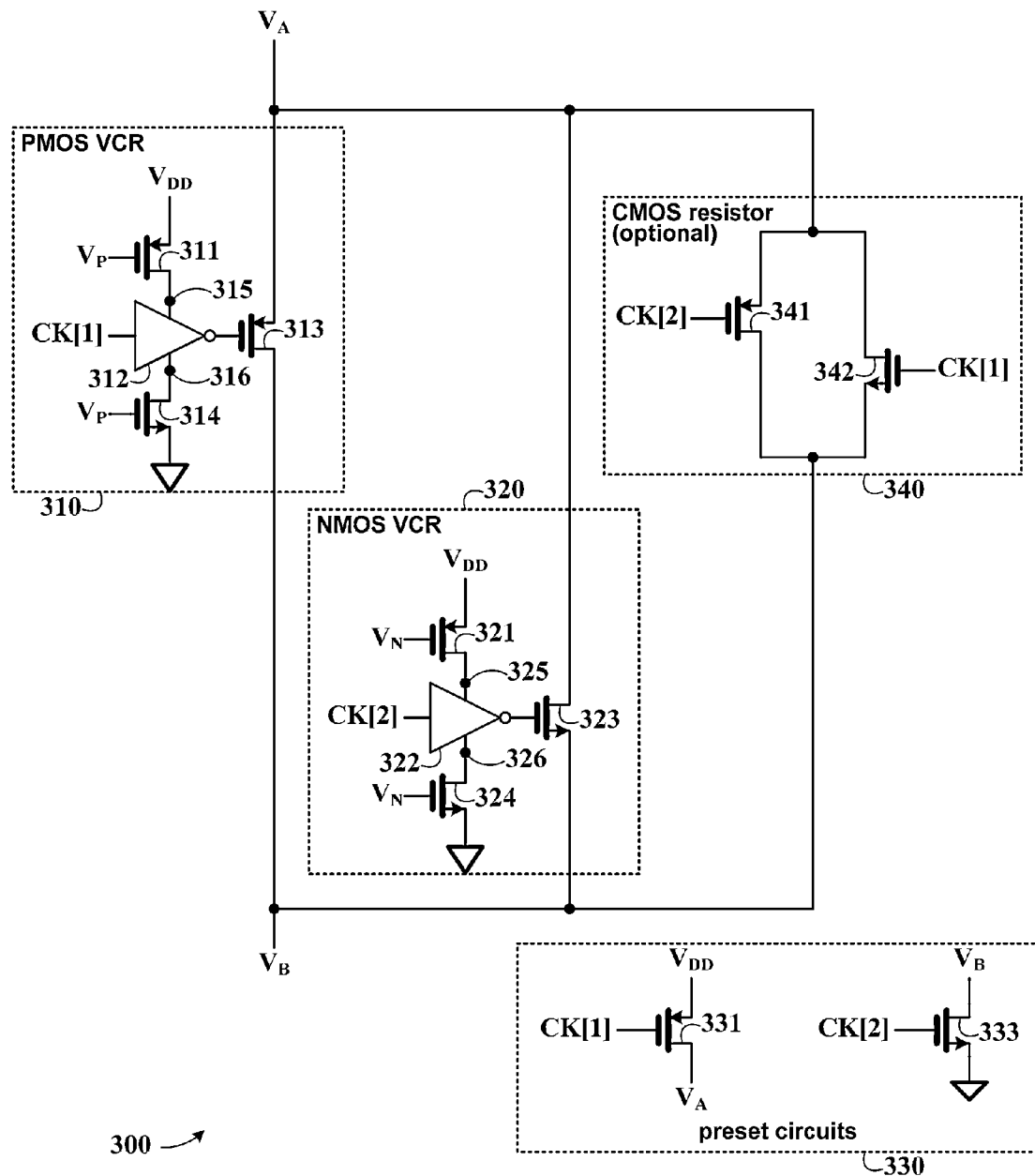
FIG. 3 shows schematic diagram of an alternative voltage-controlled resistor suitable for use in the comparator of FIG. 1A.

A schematic diagram of an alternative voltage-controlled resistor (VCR) 300 also suitable for embodying VCR 130 and 140 of FIG. 1A is shown in FIG. 3. VCR 300 comprises a "VA" terminal for coupling to either V3 or V4 (see FIG. 1A), a "VB" terminal for coupling to either V2 or V1 (see FIG. 1A), a "VP" terminal for coupling to either VC1 or VC2 (see FIG. 1A), a "VN" terminal for coupling to either VC2 or VC1 (see FIG. 1A), and two terminals "CK[1]" and "CK[2]" for coupling to the clock signal CLK (see FIG. 1A) that comprises CLK[1] and CLK[2] as mentioned earlier.

As shown in FIG. 3, VCR 300 comprises: PMOS VCR 310 (comprising an inverter 312, PMOS transistors 311 and 313, and NMOS transistor 314), NMOS VCR 320 (comprising an inverter 322, PMOS transistor 321, and NMOS transistors 323 and 324), and a set of preset circuits 230 comprising PMOS transistor 331 for pulling the voltage at terminals VA to VDD when the clock from terminal CK[1] is low and NMOS transistors 333 for pulling down the voltages at VB to ground when the clock from terminal CK[2] is high. Besides, in an embodiment not shown in the figure due to purpose of brevity but will be obvious to those of ordinary skill in the art without explicitly showing the schematics, the voltages at circuit nodes 315 and 325 are pulled up to VDD via two PMOS transistors controlled by the clock from terminal CK[1], and the voltages at circuit nodes 316 and 326 are pulled down to ground via two NMOS transistors controlled by the clock from terminal CK[2]. VCR 300 further comprises an optional CMOS resistor 340 comprising a PMOS transistor 341 controlled by the clock from terminal CK[2] and an NMOS transistor 342 controlled by the clock from terminal CK[1]. During the preset phase where the clock CLK[1] is low and the clock CLK[2] is high (see FIG. 1A and FIG. 1B), the clock at terminal CK[1] is low and the clock at terminal CK[2] is high (see FIG. 2); in this phase, the voltage at VA is pulled up to VDD, the voltage at VB is pulled down to ground, and the PMOS transistor 313, the NMOS transistor 323, and the CMOS resistor 340 are all turned off and behave like an open circuit.

During the active phase where the clock CLK[1] is high and the clock CLK[2] is low (see FIG. 1A and FIG. 1B), the clock at terminal CK[1] is high and the clock at terminal CK[2] is low (see FIG. 2); in this phase, the present circuits 330 are disabled, and the PMOS VCR 310, the NMOS VCR 320, and the CMOS resistor 340 are all turned on and behave like a resistor with a resistance controlled by the voltage at terminal "VP" and the voltage at terminal "VN". As illustrated in FIG. 1A, the "VP" and the "VN" terminals of VCR 130 interface with VC1 and VC2 respectively, while the "VP" and the "VN" terminals of VCR 140 interface with VC2 and VC1 respectively. In the active phase, a difference between VC1 and VC2 will result in a difference between the resistance of VCR 130 and the resistance of VCR 140. As mentioned earlier, this will cause one of V3 and V4 to rise to VDD while the other fall to ground.

Reference is again made to FIG. 3. The PMOS VCR 310 and NMOS VCR 320 together form a "rail-to-rail" topology so that the voltage-controlled resistor 300 can work for a range of voltages at VP and VN that spans from the ground level to the supply level VDD. In a particular application, one may choose to remove NMOS VCR 320 along with the terminal "VN" at one's discretion if one is sure that a mean value of the voltage at VN is not lower than a voltage needed for turning on PMOS transistor 321, and may choose to remove PMOS VCR 310 along with the terminal "VP" at one's discretion if one is sure that a mean value of the voltage at VP is not higher than a voltage needed for turning on NMOS transistor 314. This concept of removing unnecessary circuits and terminals in a particular application is obvious to those of ordinary skill in the art and thus not described in detail here. Also, one may choose to remove PMOS transistor 341, or NMOS transistor 342, or both, at one's discretion.

Reference is made again to FIG. 1A. In the preset phase, by pulling up to VDD or pulling down to ground internal circuit nodes, VCR 130 and VCR 140 are preset so that I1 and I2 can be maximized upon entering the active phase. This helps to speed up the task of comparison. In the active phase, after a comparison between the resistance of VCR 130 and the resistance of VCR 140 is resolved, one of V3 and V4 will fall to ground while the other rise back to VDD. In any case, both I1 and I2 will be zero. Therefore, both objectives of relatively high-speed operation and low power consumption are fulfilled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a PMOS (p-channel metal oxide semiconductor) transistor pair receiving a first voltage at a first circuit node and a second voltage at a second circuit node and outputting a third voltage at a third circuit node and a fourth voltage at a fourth circuit node;
   an NMOS (n-channel metal oxide semiconductor) transistor pair receiving the third voltage at the third circuit node and the fourth voltage at the fourth circuit node and outputting the first voltage at the first circuit node and the second voltage at the second circuit node;
   a first voltage-controlled resistor (VCR) controlled by a first control voltage and a second control voltage in accordance with a first clock signal providing a coupling between the third voltage at the third circuit node and the second voltage at the second circuit node; and a second VCR controlled by the second control voltage and the first control voltage in accordance with a second clock signal providing a coupling between the fourth voltage at the fourth circuit node and the first voltage at the first circuit node.

2. The circuit of claim 1, the first voltage-controlled resistor and the second voltage-controlled resistor are constructed from the same circuit but interface with the first control voltage and the second control voltage in different ways so that a difference between the first control voltage and the second control voltage leads to a difference between a resistance of the first voltage-controlled resistor and a resistance of the second voltage-controlled resistor.

3. The circuit of claim 1, wherein the first VCR comprises: a PMOS VCR and an NMOS VCR connected in parallel,
wherein the PMOS VCR comprises a series-connected first PMOS transistor controlled by a signal from a terminal VP and a second PMOS transistor controlled by a clock,
wherein the NMOS VCR comprises a series-connected first NMOS transistor controlled by a signal from a terminal VN and a second NMOS transistor controlled by an inverse of the clock.

4. The circuit of claim 3, further comprising a CMOS resistor connected in parallel with the PMOS VCR and the NMOS VCR, wherein the CMOS resistor comprises a PMOS transistor controlled by the clock and an NMOS transistor controlled by the inverse of the clock.

5. The circuit of claim 1, wherein the first VCR comprises: a PMOS VCR and an NMOS VCR connected in parallel,
wherein the PMOS VCR comprises an inverter receiving a clock signal, two PMOS transistors, and an NMOS transistor, wherein the NMOS transistor is connected to a ground node of the inverter, one of the PMOS transistors is connected to a power node of the inverter, and a gate of the other PMOS transistor is connected to an output of the inverter;
wherein the NMOS VCR comprises an inverter receiving an inverse of the clock signal, a PMOS transistor, and two NMOS transistors, wherein the PMOS transistor is connected to a power node of the inverter, one of the NMOS transistors is connected to a ground node of the inverter, and a gate of the other NMOS transistor is connected to an output of the inverter.

6. The circuit of claim 5, further comprising a CMOS resistor connected in parallel with the PMOS VCR and the NMOS VCR, wherein the CMOS resistor comprises a PMOS transistor controlled by the clock and an NMOS transistor controlled by the inverse of the clock.

7. A method comprising:
incorporating a PMOS (p-channel metal oxide semiconductor) transistor pair receiving a first voltage at a first circuit node and a second voltage at a second circuit node and outputting a third voltage at a third circuit node and a fourth voltage at a fourth circuit node;
incorporating an NMOS (n-channel metal oxide semiconductor) transistor pair receiving the third voltage at the third circuit node and the fourth voltage at the fourth circuit node and outputting the first voltage at the first circuit node and the second voltage at the second circuit node;
coupling the third voltage at the third circuit node to the second voltage at the second circuit node via a first voltage-controlled resistor controlled by a first control voltage and a second control voltage in accordance with a clock signal; and
coupling the fourth voltage at the fourth circuit node to the first voltage at the first circuit node via a second voltage-controlled resistor controlled by the second control voltage and the first control voltage in accordance with the clock signal.

8. The method of claim 7, wherein the first voltage-controlled resistor and the second voltage-controlled resistor are constructed from the same circuit but interface with the first control voltage and the second control voltage in different ways so that a difference between the first control voltage and the second control voltage leads to a difference between a resistance of the first voltage-controlled resistor and a resistance of the second voltage-controlled resistor.

* * * * *